United States Patent

Sogoya et al.

(10) Patent No.: US 8,710,940 B2
(45) Date of Patent: Apr. 29, 2014

(54) ELASTIC WAVE DEVICE HAVING A CAPACITIVE ELECTRODE ON THE PIEZOELECTRIC SUBSTRATE

(71) Applicant: Murata Manufacturing Co., Ltd., Nagaokakyo (JP)

(72) Inventors: Shinichi Sogoya, Nagaokakyo (JP); Tetsuro Okuda, Nagaokakyo (JP); Takuma Kuzushita, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 26 days.

(21) Appl. No.: 13/630,069

(22) Filed: Sep. 28, 2012

(65) Prior Publication Data

US 2013/0021116 A1   Jan. 24, 2013

Related U.S. Application Data

(63) Continuation of application No. PCT/JP2011/050267, filed on Jan. 11, 2011.

(30) Foreign Application Priority Data

May 13, 2010   (JP) .................................. 2010-110810

(51) Int. Cl.
  *H03H 9/64* (2006.01)
(52) U.S. Cl.
  USPC .................... 333/193; 333/195; 310/313 B
(58) Field of Classification Search
  USPC .................... 333/193–196, 133, 150, 154; 310/313 B, 313 D
  See application file for complete search history.

(56) References Cited

U.S. PATENT DOCUMENTS

| 5,821,834 | A   | * | 10/1998 | Xu et al.        | 333/193   |
|-----------|-----|---|---------|------------------|-----------|
| 5,932,950 | A   | * | 8/1999  | Yamada et al.    | 310/313 D |
| 6,472,959 | B1  | * | 10/2002 | Beaudin et al.   | 333/193   |
| 7,023,297 | B2  | * | 4/2006  | Taniguchi et al. | 333/133   |
| 7,688,161 | B2  | * | 3/2010  | Miura et al.     | 333/193   |

(Continued)

FOREIGN PATENT DOCUMENTS

| JP | 03-092009 A | 4/1991  |
|----|-------------|---------|
| JP | 05-327399 A | 12/1993 |

(Continued)

OTHER PUBLICATIONS

English language machine translation of JP 2003-283297, published Oct. 3, 2003, 3 pages.*

(Continued)

*Primary Examiner* — Barbara Summons
(74) *Attorney, Agent, or Firm* — Keating & Bennett, LLP

(57) ABSTRACT

An elastic wave device includes a piezoelectric substrate, an IDT electrode located on the piezoelectric substrate, and a capacitive electrode that is located on the piezoelectric substrate and is connected in series with the IDT electrode. The capacitive electrode includes a plurality of capacitive electrode portions, each of which includes a pair of mutually interdigitated comb-shaped electrodes. The plurality of capacitive electrode portions are connected with each other in parallel. The plurality of capacitive electrode portions are arranged such that an intersecting width direction D1 of the capacitive electrode portions is inclined with respect to an intersecting width direction D2 of the IDT electrode. The plurality of capacitive electrode portions are arrayed in an elastic-wave propagating direction D3 of the IDT electrode.

17 Claims, 8 Drawing Sheets

(56) References Cited

U.S. PATENT DOCUMENTS

| | | | |
|---|---|---|---|
| 2005/0231306 A1* | 10/2005 | Kushitani et al. | 333/195 |
| 2007/0024392 A1 | 2/2007 | Inoue et al. | |
| 2009/0201103 A1* | 8/2009 | Watanabe | 333/193 |
| 2009/0278629 A1* | 11/2009 | Tamura | 333/193 |
| 2012/0086524 A1* | 4/2012 | Komura | 333/195 |

FOREIGN PATENT DOCUMENTS

| | | | |
|---|---|---|---|
| JP | 06-232678 A | | 8/1994 |
| JP | 7-273597 | * | 10/1995 |
| JP | 08-065089 A | | 3/1996 |
| JP | 09-098056 A | | 4/1997 |
| JP | 09-167937 A | | 6/1997 |
| JP | 11-330904 | * | 11/1999 |
| JP | 2000-114923 A | | 4/2000 |
| JP | 2001-044792 | * | 2/2001 |
| JP | 2003-283297 | * | 10/2003 |
| JP | 2005-260833 A | | 9/2005 |
| JP | 2007-036856 A | | 2/2007 |
| JP | 2010-062873 A | | 3/2010 |

OTHER PUBLICATIONS

English language machine translation of JP 2001-044792, published Feb. 16, 2001, 4 pages.*

Official Communication issued in International Patent Application No. PCT/JP2011/050267, mailed on Feb. 15, 2011.

* cited by examiner

ELASTIC WAVE DEVICE HAVING A CAPACITIVE ELECTRODE ON THE PIEZOELECTRIC SUBSTRATE

BACKGROUND OF THE INVENTION

1. Field of the Invention

The present invention relates to an elastic wave device. More particularly, the present invention relates to an elastic wave device including a capacitive electrode that is connected in series with an IDT electrode on a piezoelectric substrate and that includes a comb-shaped electrode pair.

2. Description of the Related Art

Various elastic wave devices that use elastic waves, such as surface acoustic waves or boundary acoustic waves, have been used. An elastic wave device includes a piezoelectric substrate and an IDT electrode formed on the piezoelectric substrate. The elastic wave device provides, for example, a resonant characteristic and a filter characteristic by using elastic waves excited at the IDT electrode.

Meanwhile, to improve the characteristics of the elastic wave device, an additional capacitor may be provided. More specifically, for example, as described in Japanese Unexamined Patent Application Publication No. 8-65089, a capacitor may be connected in parallel with an IDT electrode that forms a ladder surface acoustic wave filter device, or a capacitor may be connected in series with the IDT electrode. If the capacitor is provided in the elastic wave device, as described in Japanese Unexamined Patent Application Publication No. 8-65089, it is known that the capacitor is formed on a piezoelectric substrate and a comb-shaped electrode pair, in which electrodes are interdigitated with each other, forms a capacitor. Since the capacitor is formed by the comb-shaped electrode pair, a facing area of the electrodes can be large, and hence a large electrostatic capacity can be obtained.

As described in Japanese Unexamined Patent Application Publication No. 8-65089, if the comb-shaped electrode pair (hereinafter, referred to as "capacitor-forming comb-shaped electrode pair") formed on the piezoelectric substrate forms the capacitor, elastic waves may be unintentionally excited at the capacitor-forming comb-shaped electrode pair. Hence, to prevent characteristics of the elastic wave device from being degraded as a result of the unintentionally generated elastic waves, the capacitor-forming comb-shaped electrode pair is preferably provided such that an intersecting width direction of the capacitor-forming comb-shaped electrode pair is perpendicular to an intersecting width direction of the IDT electrode.

However, referring to FIG. 12, if the number of pairs of electrode fingers of a capacitor-forming comb-shaped electrode pair 101 is increased to obtain a large electrostatic capacity, the capacitor-forming comb-shaped electrode pair 101 becomes long in an intersecting width direction of the IDT electrode, and hence a large unused space 103 may be formed on a piezoelectric substrate 102.

In contrast, referring to FIG. 13, if an intersecting width of a capacitor-forming comb-shaped electrode pair 101 is increased to obtain a large electrostatic capacity, unlike the state shown in FIG. 12, the capacitor-forming comb-shaped electrode pair 101 becomes long in the intersecting width direction, and hence a large unused space is substantially eliminated. Accordingly, the elastic wave device can be decreased in size. However, if the intersecting width of the capacitor-forming comb-shaped electrode pair 101 is increased, a resistance loss of the capacitor-forming comb-shaped electrode pair 101 is increased, and hence the characteristics of the elastic wave device may be degraded. More specifically, if the elastic wave device is, for example, an elastic wave filter device, an insertion loss may be increased.

SUMMARY OF THE INVENTION

Accordingly, preferred embodiments of the present invention enhance the performance and decrease the size of an elastic wave device including a capacitive electrode that is connected in series with an IDT electrode on a piezoelectric substrate and includes a comb-shaped electrode pair.

An elastic wave device according to a preferred embodiment of the present invention includes a piezoelectric substrate, an IDT electrode, and a capacitive electrode. The IDT electrode is located on the piezoelectric substrate. The capacitive electrode is located on the piezoelectric substrate. The capacitive electrode is connected in series with the IDT electrode. The capacitive electrode includes a plurality of capacitive electrode portions. Each of the plurality of capacitive electrode portions includes a pair of mutually interdigitated comb-shaped electrodes. The plurality of capacitive electrode portions are connected with each other in parallel. The plurality of capacitive electrode portions are arranged such that an intersecting width direction of the capacitive electrode portions is inclined relative to an intersecting width direction of the IDT electrode. The plurality of capacitive electrode portions are arrayed in an elastic-wave propagating direction of the IDT electrode.

In the elastic wave device according to a preferred embodiment of the present invention, at least a portion of the capacitive electrode and the IDT electrode are arrayed in a direction perpendicular or substantially perpendicular to the elastic-wave propagating direction.

In the elastic wave device according to another preferred embodiment of the present invention, each of the plurality of capacitive electrode portions includes a plurality of electrode fingers and a busbar. The plurality of electrode fingers extend in the intersecting width direction of the capacitive electrode portions. The busbar is connected with the plurality of electrode fingers. The busbar extends in a direction perpendicular or substantially perpendicular to the intersecting width direction of the capacitive electrode portions. At least one of the busbars of the plurality of comb-shaped electrodes of the plurality of capacitive electrode portions is integral with another one of the busbars of the other comb-shaped electrodes. With this configuration, since the capacitive electrode can be further decreased in size, the elastic wave device can be further decreased in size.

According to still another preferred embodiment of the present invention, the elastic wave device is a surface acoustic wave device that uses surface acoustic waves.

According to yet another preferred embodiment of the present invention, the elastic wave device is a boundary acoustic wave device that uses boundary acoustic waves.

According to a further preferred embodiment of the present invention, the elastic wave device is a ladder elastic wave filter device including a series-arm resonator having the IDT electrode. In this case, a large capacity can be achieved, and an increase in insertion loss as the result of the formation of the capacity can be prevented. Accordingly, a good filter characteristic can be obtained.

According to a still further specific preferred embodiment of the present invention, the elastic wave device further includes an inductance that is connected in series with the IDT electrode and is connected in parallel with the capacitive electrode. With this configuration, by using an LC parallel resonant circuit that is defined by the capacitive electrode and the inductance, an attenuation pole can be generated for a desirable frequency.

In the elastic wave device according to a yet further preferred embodiment of the present invention, the plurality of capacitive electrode portions are arranged such that the intersecting width direction of the capacitive electrode portions is perpendicular or substantially perpendicular to the intersecting width direction of the IDT electrode.

With various preferred embodiments of the present invention, the capacitive electrode preferably includes the plurality of capacitive electrode portions, each of which includes the pair of mutually interdigitated comb-shaped electrodes and which are connected with each other in parallel. The plurality of capacitive electrode portions are preferably arranged such that the intersecting width direction of the capacitive electrode portions is perpendicular or substantially perpendicular to the intersecting width direction of the IDT electrode. The plurality of capacitive electrode portions are arrayed in the elastic-wave propagating direction of the IDT electrode. Hence, for example, as compared with a case in which a capacitive electrode is formed of a pair of comb-shaped electrodes, an intersecting width can be small and a large capacity can be obtained. Accordingly, the performance of the elastic wave device can be enhanced while the size of the elastic wave device can be decreased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below by exemplifying an elastic wave device 1 shown in FIG. 1 as an elastic wave filter device. It is to be noted that the elastic wave device 1 is a non-limiting example of a preferred embodiment of the present invention. An elastic wave device according to the present invention is not limited to the elastic wave device 1. The elastic wave device according to the present invention may not be the elastic wave filter device, and may be, for example, an elastic wave resonator.

Figure 1:
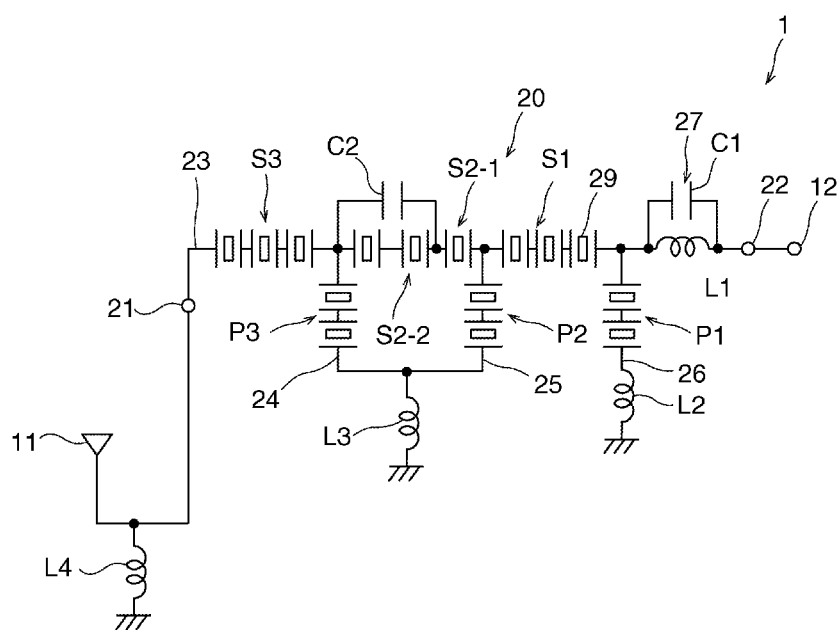
FIG. 1 is an equivalent circuit diagram of an elastic wave device according to a preferred embodiment of the present invention.
Figure 2:
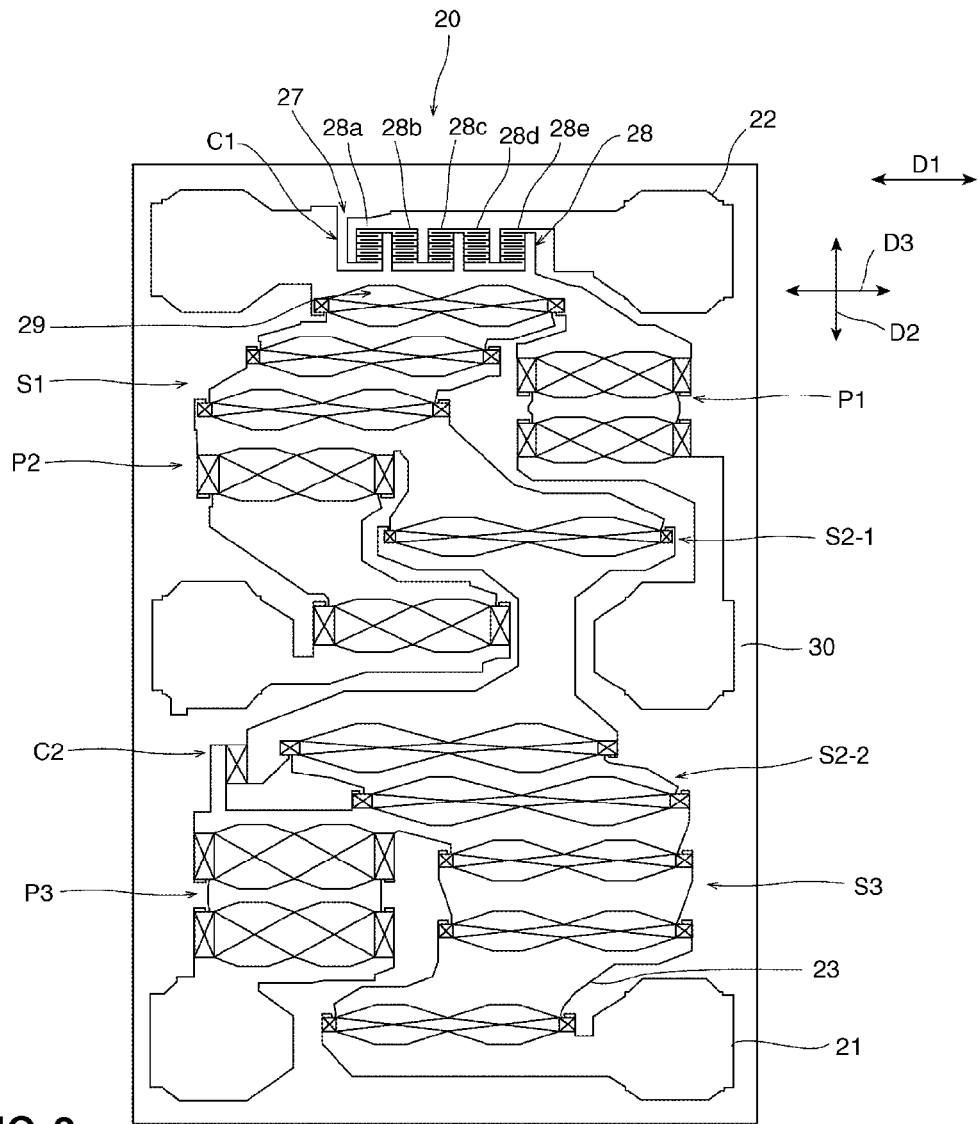
FIG. 2 is a schematic plan view of a portion of the elastic wave device according to a preferred embodiment of the present invention.
Figure 3:
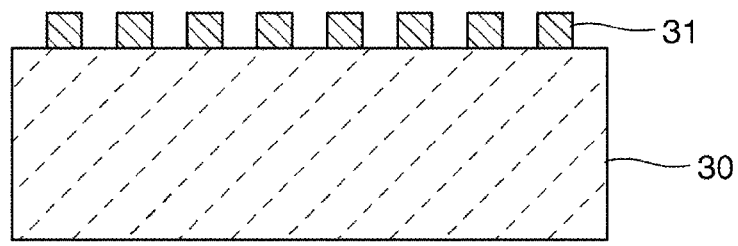
FIG. 3 is a rough cross-sectional view of a portion of an elastic wave filter device according to a preferred embodiment of the present invention.
Figure 4:
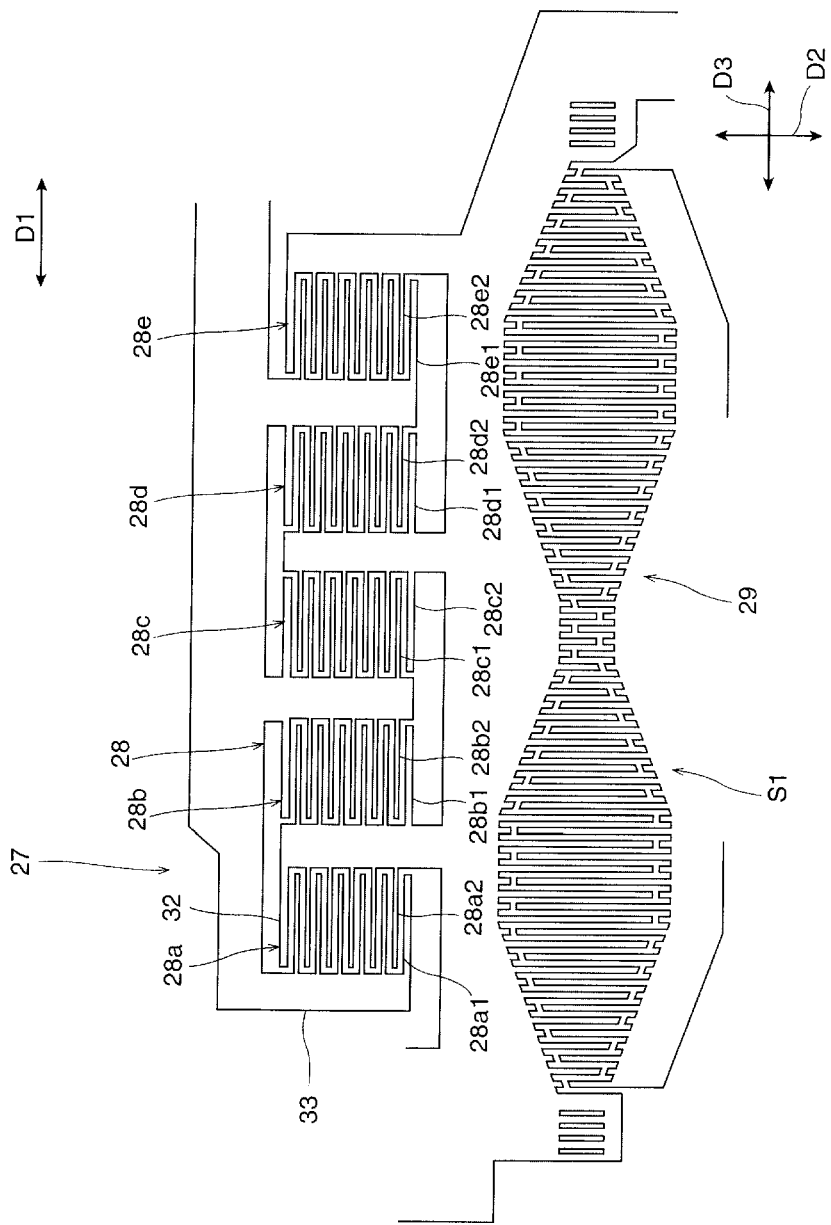
FIG. 4 is a schematic cross-sectional view showing in an enlarged manner a capacitive electrode of the elastic wave device according to a preferred embodiment of the present invention.
Figure 5:
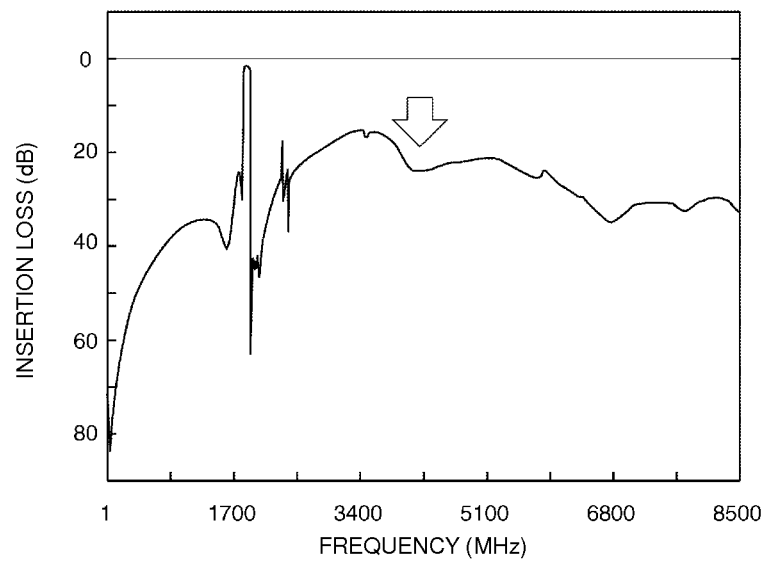
FIG. 5 is an example graph showing an insertion loss of the elastic wave device according to a preferred embodiment of the present invention.

FIG. 1 is an equivalent circuit diagram of an elastic wave device according to the present preferred embodiment. FIG. 2 is a schematic plan view of a portion of the elastic wave device according to the present preferred embodiment. FIG. 3 is a rough cross-sectional view of a portion of an elastic wave filter device according to the present preferred embodiment. FIG. 4 is a schematic cross-sectional view showing in an enlarged manner a capacitive electrode of the elastic wave device according to the present preferred embodiment. FIG. 5 is an example graph showing an insertion less of the elastic wave device according to the present preferred embodiment.

The elastic wave device 1 according to the present preferred embodiment preferably is a surface acoustic wave device that uses surface acoustic waves. More specifically, the elastic wave device 1 preferably is a ladder surface acoustic wave filter device including a ladder surface acoustic wave filter section 20. The elastic wave device 1 of the present preferred embodiment is preferably used as a transmitting band pass filter (transmitting frequency band: 1850 MHz to 1910 MHz) of a duplexer in UMTS Band 2.

The elastic wave device 1 includes a signal output terminal 21 that is connected with an antenna 11, and a signal input terminal 22 that is connected with a transmitting signal terminal 12. The ladder surface acoustic wave filter section 20 is connected between the signal output terminal 21 and the signal input terminal 22.

As shown in FIGS. 1 and 2, the ladder surface acoustic wave filter section 20 includes a series arm 23 connected between the signal input terminal 22 and the signal output terminal 21. A plurality of series-arm resonators S1, S2-1, S2-2, and S3 are connected in series with the series arm 23.

A plurality of parallel arms 24 to 26 are connected between the series arm 23 and a ground potential. Parallel-arm resonators P1 to P3 are respectively provided at the parallel arms 24 to 26. An inductance L2 is connected between the parallel-arm resonator P1 and the ground potential. An inductance L3 is connected between a node of the parallel-arm resonators P2 and P3 and the ground potential.

Each of the series-arm resonators S1, S2-1, S2-2, and S3, and the parallel-arm resonators P1 to P3 includes an IDT electrode that includes a pair of mutually interdigitated comb-shaped electrodes and two reflectors provided at both sides of the IDT electrode.

Also, a capacitor C2 is connected in parallel with the series-arm resonator S2-2.

Further, an LC resonant circuit 27 is connected between the series-arm resonator S1 and the signal input terminal 22. The LC resonant circuit 27 has an inductance L1 and a capacitor C1 that are connected with each other in parallel. Since the LC resonant circuit 27 is provided, as shown in FIG. 5, an attenuation pole indicated by an arrow is formed in an area around 4300 MHz.

The graph shown in FIG. 5 is a graph with the following design parameters.

Design Parameters

Series-arm resonator S3:
  Number of pairs of electrode fingers: 168 pairs, intersecting width: 30.29 µm, wave length: 1.8931 µm, duty ratio: 0.486, and number of rows: 3.

Series-arm resonator S2-2:
  Number of pairs of electrode fingers: 230 pairs, intersecting width: 37.34 µm, wave length: 1.9232 µm, duty ratio: 0.475, and number of rows: 2.

Series-arm resonator S2-1:
  Number of pairs of electrode fingers: 200 pairs, intersecting width: 30.47 µm, wave length: 1.9148 µm, duty ratio: 0.441, and number of rows: 1.

Series-arm resonator S1:
  Number of pairs of electrode fingers: 168 pairs, intersecting width: 30.26 µm, wave length: 1.8938 µm, duty ratio: 0.476, and number of rows: 3.

Parallel-arm resonator P3:
  Number of pairs of electrode fingers: 124 pairs, intersecting width: 58.22 µm, wave length: 1.9811 µm, duty ratio: 0.475, and number of rows: 2.

Parallel-arm resonator P2:
  Number of pairs of electrode fingers: 120 pairs, intersecting width: 49.47 µm, wave length: 1.9744 µm, duty ratio: 0.475, and number of rows: 2.

Parallel-arm resonator P1:
  Number of pairs of electrode fingers: 104 pairs, intersecting width: 42.77 µm, wave length: 1.9828 µm, duty ratio: 0.475, and number of rows: 2.

Capacitor C1: 0.57 pF
Capacitor C2: 0.21 pF
Inductance L1: 1.5 nH
Inductance L2: 0.1 nH
Inductance L3: 1.0 nH
Inductance L4: 3.6 nH As shown in FIG. 3, the ladder surface acoustic wave filter section 20 includes a piezoelectric substrate 30 and an electrode 31 located on the piezoelectric substrate 30. This electrode 31 defines the above-described series arm 23, parallel arms 24 to 26, series-arm resonators S1, S2-1, S2-2, and S3, parallel-arm resonators P1 to P3, LC resonant circuit 27, etc. The inductances L1 to L3 include electrodes located on a mount substrate (not shown) on which the piezoelectric substrate 30 is mounted.

The piezoelectric substrate 30 may be a substrate made of a proper piezoelectric material. For example, the piezoelectric substrate 30 may be formed of $LiTaO_3$, $LiNbO_3$, quartz crystal, or piezoelectric ceramic. The electrode 31 may be formed of a proper conductive material. For example, the electrode 31 may be formed of a metal, such as Al, Pt, Au, Ag, Cu, Ni, Ti, or Pd, or an alloy containing at least one of such metals. Alternatively, the electrode 31 may be formed of, for example, a laminated body of a plurality of conductive films made of the metal or alloy.

Next, the capacitor C1 will be described in detail. The capacitor C1 includes a capacitive electrode 28 (see FIG. 2) that is located on the piezoelectric substrate 30 and is connected in series with an IDT electrode 29 that defines a portion of the series-arm resonator S1. As shown in FIG. 4, the capacitive electrode 28 and the IDT electrode 29 are arrayed in an intersecting width direction D2 that is perpendicular or substantially perpendicular to an elastic-wave propagating direction D3.

The capacitive electrode 28 includes a plurality of capacitive electrode portions 28a to 28e that are connected with each other in parallel. The plurality of capacitive electrode portions 28a to 28e respectively include pairs of mutually interdigitated comb-shaped electrodes 28a1 and 28a2, 28b1 and 28b2, 28c1 and 28c2, 28d1 and 28d2, and 28e1 and 28e2. Each of the comb-shaped electrodes 28a1, 28a2, 28b1, 28b2, 28c1, 28c2, 28d1, 28d2, 28e1, and 28e2 includes a plurality of electrode fingers 32 and a busbar 33 connected with the plurality of electrode fingers 32. In the present preferred embodiment, at least one of busbars 33 of the plurality of comb-shaped electrodes 28a1, 28a2, 28b1, 28b2, 28c1, 28c2, 28d1, 28d2, 28e1, and 28e2 of the plurality of capacitive electrode portions 28a to 28e preferably is integrally formed with another one of the busbars 33 of the other plurality of comb-shaped electrodes 28a1, 28a2, 28b1, 28b2, 28c1, 28c2, 28d1, 28d2, 28e1, and 28e2. More specifically, in the present preferred embodiment, the busbar 33 of the comb-shaped electrode 28a2 preferably is integrally formed with the busbar 33 of the comb-shaped electrode 28b1. The busbar 33 of the comb-shaped electrode 28b2 preferably is integrally formed with the busbar 33 of the comb-shaped electrode 28c1. The busbar 33 of the comb-shaped electrode 28c2 preferably is integrally formed with the busbar 33 of the comb-shaped electrode 28d1. The busbar 33 of the comb-shaped electrode 28d2 preferably is integrally formed with the busbar 33 of the comb-shaped electrode 28e1. Hence, for example, the capacitive electrode 28 can be decreased in size as compared with a case in which the busbars 33 are individually provided. Accordingly, the elastic wave device 1 can be decreased in size.

In the present preferred embodiment of the present invention, the plurality of capacitive electrode portions 28a to 28e are preferably arranged such that an intersecting width direction D1 of the capacitive electrode portions 28a to 28e is perpendicular or substantially perpendicular to the intersecting width direction D2 of the IDT electrode 29. Also, the plurality of capacitive electrode portions 28a to 28e are arrayed in the elastic-wave propagating direction D3 of the IDT electrode 29. The elastic-wave propagating direction D3 is parallel or substantially parallel to the intersecting width direction D1. Hence, the plurality of electrode fingers 32 are arranged to extend in the intersecting width direction D1 (=the elastic-wave propagating direction D3). The busbars 33 are arranged to extend in the intersecting width direction D2.

In the present preferred embodiment, the intersecting width direction D1 of the capacitive electrode portions 28a to 28e is perpendicular or substantially perpendicular to the intersecting width direction D2 of the IDT electrode 29. However, the present invention is not limited to this configuration. The intersecting width direction of the capacitive electrode sections does not have to be perpendicular or substantially perpendicular to the intersecting width direction of the IDT electrode as long as those directions are inclined to each other.

As described above, in the present preferred embodiment, the capacitive electrode 28 is arranged such that the plurality of capacitive electrode portions 28a to 28e are connected with each other in parallel. Hence, even if the intersecting width of each of the capacitive electrode portions 28a to 28e is small, a large electrostatic capacity can be obtained. Accordingly, a large electrostatic capacity can be obtained, and an insertion loss of the elastic wave device 1 can be prevented from increasing.

Advantages will be described in detail below according to specific examples.

Figure 6:
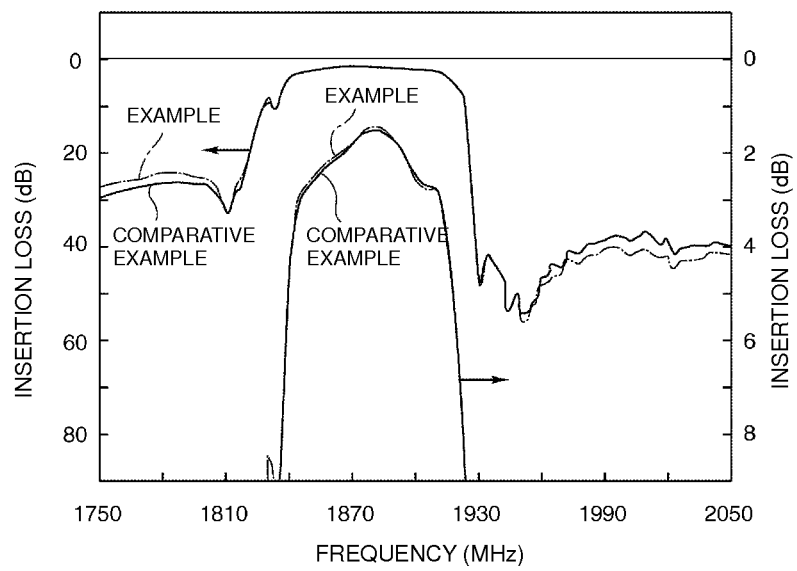
FIG. 6 is a graph showing filter characteristics of elastic wave filter devices according to an example of a preferred embodiment of the present invention and a comparative example.
Figure 7:
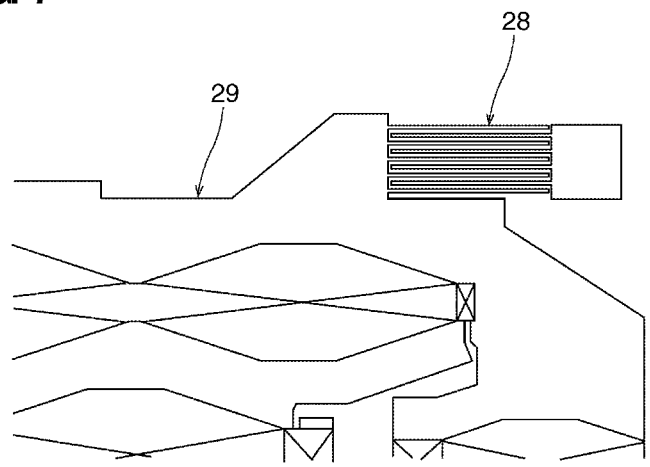
FIG. 7 is a schematic plan view of a portion of the elastic wave device according to the comparative example.

FIG. 6 shows a filter characteristic of an elastic wave device according to a non-limiting example of a preferred embodiment of the present invention having a configuration similar to that of the elastic wave device according to the above-described preferred embodiment. FIG. 6 also shows a filter characteristic of an elastic wave device according to a comparative example having a configuration similar to that of the aforementioned example except that a capacitive electrode 28 was formed of a pair of comb-shaped electrodes as shown in FIG. 7 and was formed such that an electrostatic capacity value of a capacitor C1 is 0.30 pF. In the example, all intersecting widths of the capacitive electrode portions 28a to 28e were about 34 μm. In the comparative example, the intersecting width was about 89 μm.

As shown in FIG. 6, the elastic wave device 1 according to the example of a preferred embodiment of the present invention had an electrostatic capacity value of the capacitor C1 that is substantially twice as large as an electrostatic capacity value of the elastic wave device according to the comparative example, and had an insertion loss in a pass band (1850 MHz to 1910 MHz) that is equivalent to an insertion loss in the pass band according to the comparative example. Therefore, it is clear that, by forming the capacitive electrode 28 with the plurality of parallel-connected capacitive electrode portions 28a to 28e and by decreasing the intersecting widths of the capacitive electrode portions 28a to 28e, the large electrostatic capacity can be obtained and the insertion loss can be prevented from increasing in the pass band.

Also, in the present preferred embodiment, the intersecting width direction D1 of the capacitive electrode portions 28a to 28e preferably is perpendicular or substantially perpendicular to the intersecting width direction D2 of the IDT electrode 29. Accordingly, if the surface acoustic waves are excited at the capacitive electrode portions 28a to 28e, the excitation of the surface acoustic waves does not substantially affect the characteristics of the elastic wave device 1. Accordingly, the characteristics of the elastic wave device 1 can be prevented from being degraded.

Further, in the present preferred embodiment, the plurality of capacitive electrode portions 28a to 28e are arrayed in the elastic-wave propagating direction D3 of the IDT electrode 29. Hence, like the IDT electrode 29, the capacitive electrode 28 is long in the elastic-wave propagating direction D3. Accordingly, an unused space is substantially eliminated from the piezoelectric substrate 30. Further, if the electrostatic capacity value of the capacitor C1 can be increased, the inductance value that is requested for the inductance L1 is decreased. The mount substrate that forms the inductance L1 can be decreased in size. Accordingly, the piezoelectric substrate 30 and the mount substrate can be decreased in size, and consequently, the elastic wave device 1 can be decreased in size.

Modifications of the above-described preferred embodiment will be described below. In the following description, like reference signs refer like members having functions that are substantially similar to those of the above-described preferred embodiment, and redundant description is omitted.

First and Second Modifications

Figure 8:
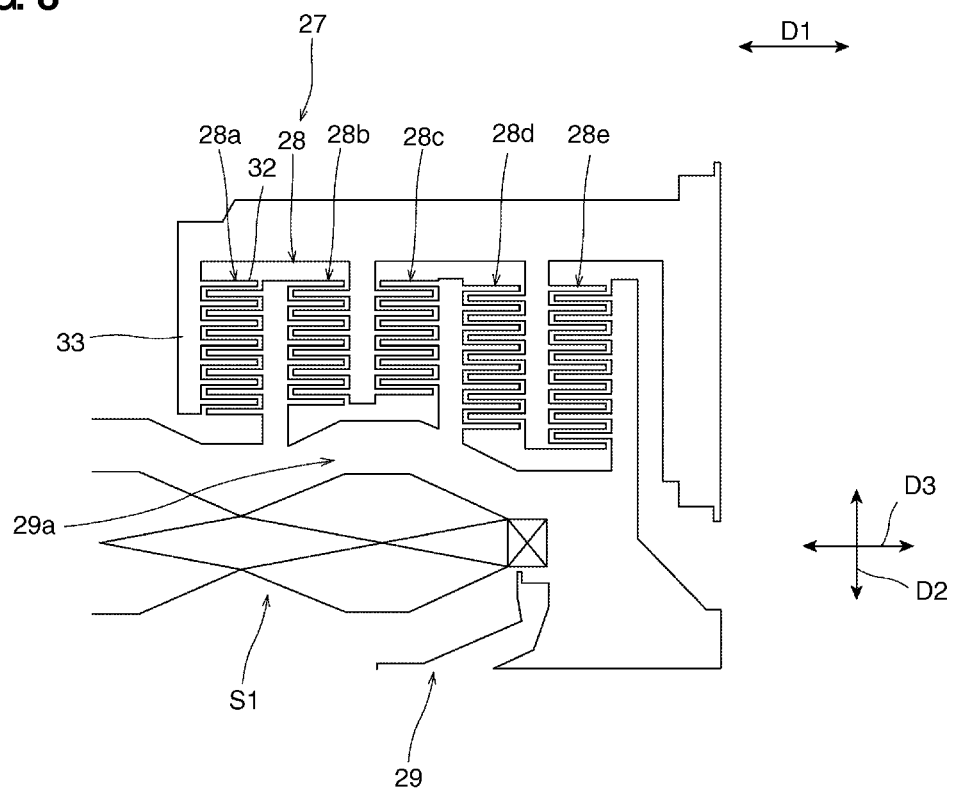
FIG. 8 is a schematic plan view of a portion of an elastic wave device according to a first modification of a preferred embodiment of the present invention.
Figure 9:
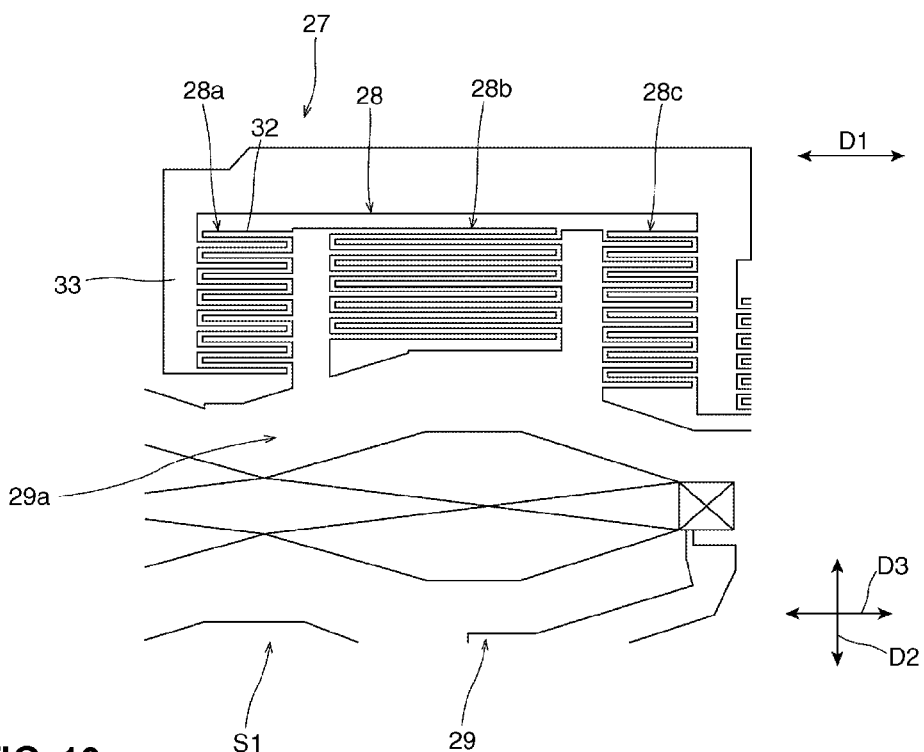
FIG. 9 is a schematic plan view of a portion of an elastic wave device according to a second modification of a preferred embodiment of the present invention.

FIG. 8 is a schematic plan view of a portion of an elastic wave device according to a first modification of a preferred embodiment of the present invention. FIG. 9 is a schematic plan view of a portion of an elastic wave device according to a second modification a preferred embodiment of the present invention.

In the above-described preferred embodiment, the capacitive electrode portions 28a to 28e have substantially equivalent shapes. Alternatively, in the present invention, the capacitive electrode portions 28a to 28e may have different shapes. More specifically, in the present invention, as long as a plurality of capacitive electrode portions each include a pair of comb-shaped electrodes, the number of pairs of electrode fingers, an intersecting width, a pitch of electrode fingers, etc. of each electrode portion are not particularly limited.

For example, as shown in FIG. 8, the capacitive electrode portions 28a to 28e may have different numbers of pairs of electrode fingers. Also, as shown in FIG. 9, the capacitive electrode portions 28a to 28e may have different intersecting widths.

In the first modification shown in FIG. 8, a busbar 29a of an IDT electrode 29 arranged by anodization weighting has projections and depressions at the outer periphery in accordance with intersecting widths, and the numbers of pairs of electrode fingers of the capacitive electrode portions 28a to 28e are determined in accordance with the protrusions and depressions. Specifically, the numbers of pairs of electrode fingers of the capacitive electrode portions 28a to 28e are increased as intersecting widths of portions of the IDT electrode 29 adjacent thereto in the intersecting width direction D2 are decreased. More specifically, the capacitive electrode portion 28c, which is adjacent to a portion of the IDT electrode 29 with a large intersecting width and a large dimension in the intersecting width direction D2, has a small number of pairs of electrode fingers and hence has a small dimension in the intersecting width direction D2. The capacitive electrode portions 28a and 28e, which are adjacent to portions of the IDT electrode 29 with small intersecting widths and small dimensions in the intersecting width direction D2, have large numbers of pairs of electrode fingers and hence have large dimensions in the intersecting width direction D2. The number of pairs of electrode fingers of the capacitive electrode portion 28b is between the number of pairs of electrode fingers of the capacitive electrode portion 28a and the number of pairs of electrode fingers of the capacitive electrode portion 28c. The number of pairs of electrode fingers of the capacitive electrode portion 28d is between the number of pairs of electrode fingers of the capacitive electrode portion 28c and the number of pairs of electrode fingers of the capacitive electrode portion 28e.

In the second modification shown in FIG. 9, like the first modification, the number of pairs of electrode fingers of the capacitive electrode portions 28a to 28e are increased as intersecting widths of portions of the IDT electrode 29 adjacent thereto in the intersecting width direction D2 are decreased. Also, as the numbers of pairs of electrode fingers of the capacitive electrode portions 28a to 28e are decreased, the intersecting widths are increased. Specifically, in this modification, the capacitive electrode portion 28b preferably has a larger intersecting width than intersecting widths of the other capacitive electrode portions 28a, and 28c to 28e. Accordingly, the elastic wave device can be occasionally further decreased in size.

Third and Fourth Modifications

Figure 10:
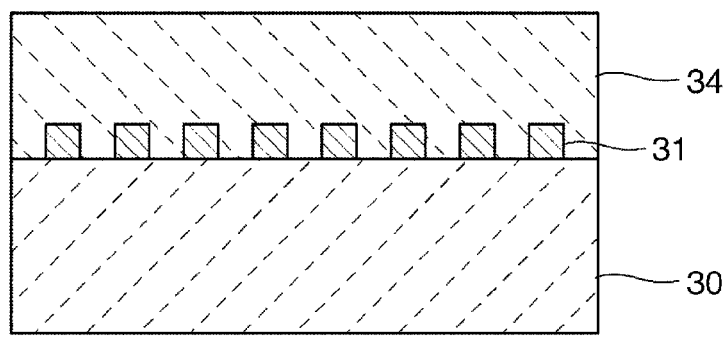
FIG. 10 is a rough cross-sectional view of an elastic wave filter device according to a third modification of a preferred embodiment of the present invention.
Figure 11:
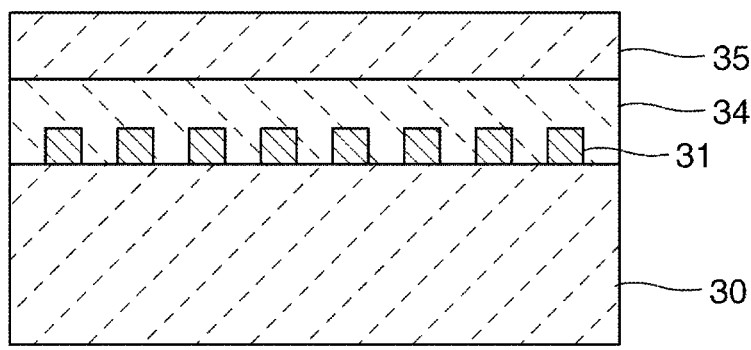
FIG. 11 is a rough cross-sectional view of an elastic wave filter device according to a fourth modification of a preferred embodiment of the present invention.
Figure 12:
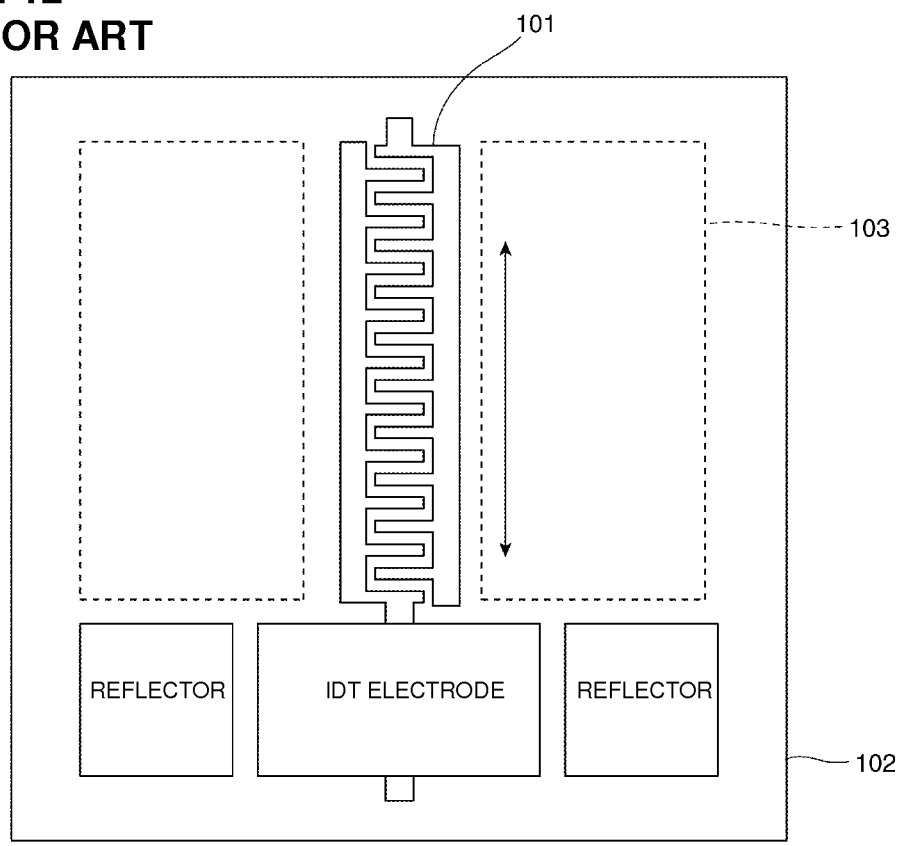
FIG. 12 is a schematic plan view for explaining arrangement of an IDT electrode and a capacitor-forming comb-shaped electrode pair of an elastic wave device according to a first reference example.
Figure 13:
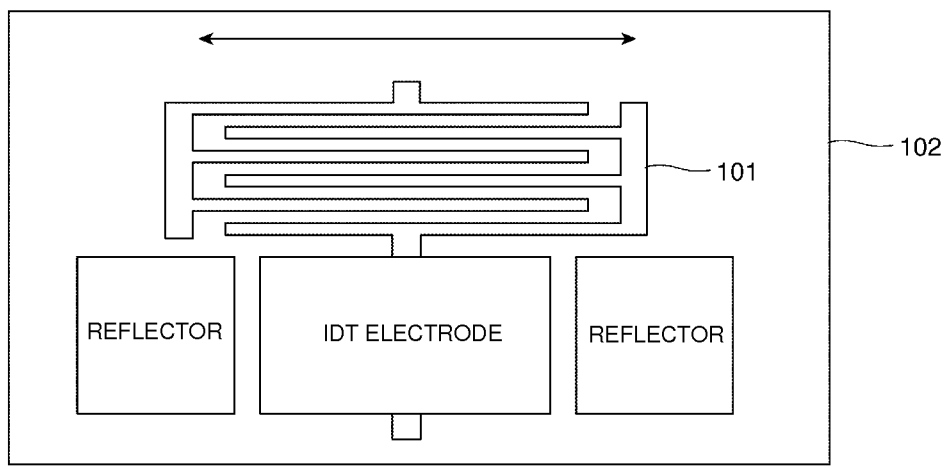
FIG. 13 is a schematic plan view for explaining arrangement of an IDT electrode and a capacitor-forming comb-shaped electrode pair of an elastic wave device according to a second reference example.

FIG. 10 is a rough cross-sectional view of an elastic wave filter device according to a third modification a preferred embodiment of the present invention. FIG. 11 is a rough cross-sectional view of an elastic wave filter device according to a fourth modification a preferred embodiment of the present invention.

In the above-described preferred embodiment, the surface acoustic wave device that uses surface acoustic waves is exemplified as a preferred embodiment of the present invention. However, the elastic wave device of the present invention is not limited to the surface acoustic wave device. The present invention can be properly applied to a boundary acoustic wave device in addition to the surface acoustic wave device. That is, the elastic wave device of a preferred embodiment of the present invention may be a boundary acoustic wave device that uses boundary acoustic waves. More specifically, the elastic wave device of a preferred embodiment of the present invention may be, for example, a two-medium boundary acoustic wave device as shown in FIG. 10, or a three-medium boundary acoustic wave device as shown in FIG. 11.

As shown in FIG. 10, in the two-medium boundary acoustic wave device, a dielectric layer 34 is located on a piezoelectric substrate 30. The dielectric layer 34 covers a region in which boundary acoustic waves propagate, such as a region in which an IDT electrode is provided. The thickness of the dielectric layer 34 is not particularly limited as long as the thickness causes elastic waves that are excited by the IDT electrode to become boundary acoustic waves, and hence the thickness may be properly determined in accordance with required characteristics. The dielectric layer 34 may be formed of, for example, silicon dioxide such as $SiO_2$ or silicon nitride such as SiN.

As shown in FIG. 11, in the three-medium boundary acoustic wave device, another dielectric layer 35 is provided on the dielectric layer 34. The dielectric layer 35 is formed of a material such that the elastic velocity in the dielectric layer 35 is higher than the elastic velocity in the dielectric layer 34. Specifically, for example, if the dielectric layer 34 is formed of silicon oxide such as $SiO_2$, the dielectric layer 35 is formed of silicon nitride such as SiN. Accordingly, boundary acoustic waves are substantially enclosed and propagate in the dielectric layer 34.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device, comprising:
    a piezoelectric substrate;
    an IDT electrode located on the piezoelectric substrate; and
    a capacitive electrode located on the piezoelectric substrate and connected in series with the IDT electrode; wherein
    the capacitive electrode includes a plurality of capacitive electrode portions which are connected with each other in parallel and each of which includes a pair of mutually interdigitated comb-shaped electrodes;
    the plurality of capacitive electrode portions are arranged such that an intersecting width direction of the capacitive electrode portions is inclined with respect to an intersecting width direction of the IDT electrode; and
    the plurality of capacitive electrode portions are arrayed in an elastic-wave propagating direction of the IDT electrode.

2. The elastic wave device according to claim 1, wherein at least a portion of the capacitive electrode and the IDT electrode are arrayed in a direction perpendicular or substantially perpendicular to the elastic-wave propagating direction.

3. The elastic wave device according to claim 1, wherein each of the plurality of capacitive electrode portions includes a plurality of electrode fingers extending in the intersecting width direction of the capacitive electrode portions, and a busbar connected with the plurality of electrode fingers and extending in a direction perpendicular or substantially perpendicular to the intersecting width direction of the capacitive electrode portions; and
    at least one of the busbars of the plurality of comb-shaped electrodes of the plurality of capacitive electrode portions is integral with another one of the busbars of the other comb-shaped electrodes.

4. The elastic wave device according to claim 1, wherein the elastic wave device is a surface acoustic wave device that uses surface acoustic waves.

5. The elastic wave device according to claim 1, wherein the elastic wave device is a boundary acoustic wave device that uses boundary acoustic waves.

6. The elastic wave device according to claim 1, wherein the elastic wave device is a ladder elastic wave filter device including a series-arm resonator having the IDT electrode.

7. The elastic wave device according to claim 6, further comprising an inductance that is connected in series with the IDT electrode and is connected in parallel with the capacitive electrode.

8. The elastic wave device according to claim 1, wherein the plurality of capacitive electrode portions are arranged such that the intersecting width direction of the capacitive electrode portions is perpendicular or substantially perpendicular to the intersecting width direction of the IDT electrode.

9. The elastic wave device according to claim 1, wherein the capacitive electrode portions have substantially equivalent shapes.

10. The elastic wave device according to claim 1, wherein the capacitive electrode portions have different shapes.

11. The elastic wave device according to claim 1, wherein the capacitive electrode portions have different numbers of pairs of electrode fingers.

12. The elastic wave device according to claim 1, wherein the capacitive electrode portions have different intersecting widths.

13. The elastic wave device according to claim 1, wherein a busbar of the IDT electrode includes projections and depressions at an outer periphery.

14. The elastic wave device according to claim 1, wherein the elastic wave device is a two-medium boundary acoustic wave device.

15. The elastic wave device according to claim 14, further comprising a dielectric layer located on the piezoelectric substrate.

16. The elastic wave device according to claim 1, wherein the elastic wave device is a three-medium boundary acoustic wave device.

17. The elastic wave device according to claim 16, further comprising a dielectric layer located on the piezoelectric substrate.

* * * * *